United States Patent
Westphal

(10) Patent No.: US 6,501,275 B1
(45) Date of Patent: Dec. 31, 2002

(54) GRADIENT COIL ARRANGEMENT COMPRISING DAMPENING OF INNER MECHANICAL VIBRATIONS

(75) Inventor: Michael Westphal, Offenbach (DE)

(73) Assignee: Bruker Biospin GmbH, Rheinstetten (DE)

( * ) Notice: Subject to any disclaimer, the term of this patent is extended or adjusted under 35 U.S.C. 154(b) by 87 days.

(21) Appl. No.: 09/663,789

(22) Filed: Sep. 18, 2000

(30) Foreign Application Priority Data

Oct. 2, 1999 (DE) .......................................... 199 47 539

(51) Int. Cl.$^7$ ................................................ G01V 3/00
(52) U.S. Cl. ....................................................... 324/319
(58) Field of Search ................................ 324/319, 309, 324/307, 318, 320

(56) References Cited

U.S. PATENT DOCUMENTS

| | | | |
|---|---|---|---|
| 4,881,035 A | | 11/1989 | Siebold |
| 5,083,085 A | | 1/1992 | Morad |
| 5,177,442 A | | 1/1993 | Roemer |
| 5,296,810 A | * | 3/1994 | Morich ....................... 324/318 |
| 5,323,135 A | | 6/1994 | Schmidt et al. |
| 5,343,148 A | | 8/1994 | Westphal et al. |
| 5,489,848 A | * | 2/1996 | Furukawa ................... 324/318 |
| 5,530,355 A | * | 6/1996 | Doty ........................... 324/318 |
| 5,539,367 A | * | 7/1996 | Xu et al. ..................... 324/318 |
| 5,581,223 A | * | 12/1996 | Ono et al. .................... 324/318 |
| 5,633,587 A | * | 5/1997 | Hirumachi ................... 324/319 |
| 5,661,399 A | * | 8/1997 | Sellers ........................ 324/318 |
| 5,892,359 A | * | 4/1999 | Yui et al. ..................... 324/318 |
| 5,959,454 A | * | 9/1999 | Westphal et al. ............ 324/319 |
| 6,078,177 A | * | 6/2000 | Petropoulos et al. ........ 324/318 |
| 6,100,692 A | * | 8/2000 | Petropoulos et al. ........ 324/309 |
| 6,329,266 B1 | * | 12/2001 | Hwang et al. ............... 438/424 |

FOREIGN PATENT DOCUMENTS

| | | |
|---|---|---|
| DE | 39 00 725 | 7/1990 |
| GB | 2 229 820 | 3/1990 |
| WO | WO 99/28 757 | 6/1999 |

OTHER PUBLICATIONS

Shvartsman et al. "A New Supershielding Method Applied to the Design of Gradient Coils," Proceedings ISMRM 1999, Philadelphia, USA.

Jehenson, et al., Analytical Method for the Compensation of Eddy–Current Effects . . . , Journal of Magnetic Resonance 90, 264–276 (1990).

* cited by examiner

Primary Examiner—Edward Lefkowitz
Assistant Examiner—Dixomara Vargas
(74) Attorney, Agent, or Firm—Paul Vincent

(57) ABSTRACT

The invention concerns a gradient system of a magnetic resonance apparatus comprising an additional, rigidly mechanically coupled highly conductive shielding cylinder which dampens excitation of mechanical vibrations of the apparatus during gradient switching.

14 Claims, 3 Drawing Sheets

GRADIENT COIL ARRANGEMENT COMPRISING DAMPENING OF INNER MECHANICAL VIBRATIONS

This application claims Paris Convention priority of DE 199 47 539.3 filed Oct. 2, 1999 the complete disclosure of which is hereby incorporated by reference.

BACKGROUND OF THE INVENTION

The invention concerns a gradient coil arrangement for a magnetic resonance apparatus comprising a main field magnet system having a pipe-shaped opening for receiving the object to be examined, a gradient coil system located in said opening, and a pipe-shaped shielding cylinder surrounding the gradient coil system, being surrounded by the main field magnet system, and having a large electrical conductive value. The electrical conductive value is defined as the product between the electric conductivity and the wall thickness of the cylinder.

An arrangement of this type is disclosed in DE 39 00 725 A1. The main field magnet system described therein comprises a superconducting cylindrically-symmetric main field coil cooled to the boiling temperature of liquid helium. It is installed in a helium tank containing liquid helium consisting in general of non-magnetic stainless steel, and has the shape of a hollow cylinder. The tank is surrounded by at least one cooled radiation shield which consists in general of sheet metal having a large electric conductivity, e.g. aluminium, but can also consist of non-magnetic steel with poor electric conductivity. The helium tank and also the radiation shields are installed in the outer vacuum case - a metallic, evacuated outer shell having a pipe-shaped axial opening. The outer vacuum case forms, together with the installed radiation shields and tanks, the cryostat of the magnet system. The superconducting main field coil has an optimized geometric design such that the main field coil generates a homogeneous magnetic field $B_z$ in an approximately spherical examination volume about the geometric center of the opening in the direction of the axis of the room temperature pipe (z axis) which is suitable for magnetic resonance examinations. The diameter of the examination volume is generally approximately half the size of the diameter of the room temperature pipe. The relative deviations of the magnetic field from its average value are frequently only a few ppm (parts per million) in the examination volume, e.g. <10 ppm. The pipe-shaped gradient system is located in the room temperature bore of the cryostat which also surrounds the examination volume. The gradient system contains, in general, three gradient coils to which temporally varying electric currents can be fed for generating corresponding temporally varying magnetic gradient fields, $dB_z/dz$, $dB_z/dy$ and $dB_z/dx$ in the examination volume. X and y are thereby perpendicular to each other and to the z axis. The electric currents are generally switched on and off in the gradient coils to thereby switch the associated gradient coils on and off within a few 100 microseconds. The gradient coils are generally rigidly mechanically connected to a supporting structure, e.g. a supporting pipe.

Gradient coils of older design generate magnetic stray fields in the area of the metallic radiation shields of the cryostat of the main field magnet. Subsequently, during switching of the currents in the gradient coils, temporally varying eddy currents are induced in the metallic structures whose magnetic fields are superimposed on the magnetic field of the gradients as undesired temporal and spatial disturbances. Gradient coils of newer design, e.g. according to U.S. Pat. No. 5,323,135 are actively shielded and only generate very small stray fields in the area of the main field magnet and its metal structure to considerably reduce this problem. With these coils, one radially inner gradient coil is basically surrounded by an encasing radially outer shielding coil through which the same current flows and whose conductor paths are disposed such that the entire field of this arrangement theoretically or approximately vanishes in the volume radially out side of the shielding coil.

When calculating the optimum geometric course of the conductor paths of an active shielding coil, one generally tries to approximate the path of the electric current density in a layered "ideal" shielding. A theoretically ideal shielding in this sense is an infinitely long shielding cylinder with infinitely large electric conductivity which surrounds the gradient coil at a certain radial separation. During charging of a gradient coil, an electric current density distribution is induced in this shielding cylinder which completely compensates for the magnetic field of the gradient coil in the entire volume outside of the shielding cylinder, i.e. in the area of the cryostat and the main field coil. The same current density distribution is also given in a shielding cylinder having finite conductivity, if the gradient coil is operated with alternating current for the limiting case of infinitely large frequencies. To obtain ideal shielding, the shielding cylinder must not be a circular cylinder. Any structure is suitable which divides the volume into two completely separate half-volumes, an inner and an outer half-volume, wherein the gradient coil is located in the inner half-volume. There are no fields present in the outer half-volume. Examples thereof are elliptic shielding cylinders or also dented pipes. Since the axial length of the gradient coils is limited, such an "ideal" shielding cylinder does not have to be infinitely long but only slightly longer than the gradient coil. The publication Sh. Shvartsman, R. Brown, H. Fujita, M. Morich, L. Petropoulos, J. Willig, "A New Supershielding Method Applied to the Design of Gradient Coils", Proceedings ISMRM 1999, Philadelphia, US describes gradient coils with which an ideally functioning shielding cylinder can have a finite, relatively small length.

The infinitely large electric conductivity can indeed only be realized with superconducting materials which must currently, even for the case of high temperature superconductors, be cooled to temperatures of less than 100 K and, as described e.g. in DE 39 00 725 A1 , are mounted to or in the helium tank. In the case of high temperature superconductors, such a shielding cylinder can also be mounted on a radiation shield of the cryostat.

As mentioned above, one attempts, with actively shielded gradient coils, to approximate an ideal shielding cylinder or an inductively generated current density path through a conductor extending in windings and carrying the same current as the gradient coil. This conductor path is thereby generally produced by grooves milled or cut into a cylindrical copper pipe. This produces a very good, however, due to mechanical tolerances, nevertheless imperfect shielding effect, which is comparable to that of an ideal shielding cylinder. In addition to DE 39 00 725 A1, numerous other publications describe a shielding cylinder with large finite or infinitely large electrical conductive value, e.g. PCT application WO 99/28757 or U.S. Pat. No. 4,881,035. The shielding cylinder is always a component of the cryostat, mainly since shielding cylinders having the desired high conductive values are particularly easy to realize at the low temperatures within a cryostat or since it must be mechanically decoupled from the gradient coil system itself for fundamental reasons (e.g. WO 99/28757).

Switching of currents in the gradient coils in the strong magnetic field of the main field magnet creates Lorentz forces acting on the electric conductors of the gradient coil and on the radiation shields in the cryostat of the main field magnet through which eddy currents flow. The sum of the Lorentz forces acting on all electric conductors of a gradient coil can be, depending on the detailed geometric design of the gradient coil, translational or rotational. Often, the translational and rotational forces acting on the supporting structure of the gradient coil vanish due to their symmetry. In this case, only "internal forces" occur which neither displace nor turn but deform the supporting structure.

Translational and rotational forces acting on the gradient system act in an inverse direction on the main field magnet (action=reaction). Since actively shielded gradient coils theoretically do not generate a stray field outside of the shielding coil, these coils cannot exert any force on the main field magnet. Consequently (action=reaction), the sum of all translational and rotational forces which the main field magnet exerts on the gradient coil and its supporting structure also vanishes. Irrespective thereof, Lorentz forces act on each conductor element of such a gradient coil. These forces, however, can merely mechanically deform the supporting structure and not displace or turn it.

The x- or y- head gradient coil known from U.S. Pat. No. 5,343,148 is an example of a gradient coil, wherein, in the absence of active shielding, particularly strong rotational forces or torques become effective. Without shielding, such coils have the tendency to rotate through 90°. With actively shielded coils of this type, the torque vanishes for the reason mentioned, i.e. the torques acting on the gradient coil and the shielding coil are opposite and equal. As described in U.S. Pat. No. 5,343,148, it is therefore important that both coils are rigidly mechanically connected, e.g. cast together with glass fiber-reinforced plastic resin.

If such a gradient coil is not actively shielded such as e.g. in the preferred embodiment known from U.S. Pat. No. 5,177,442, eddy current distributions of a similar geometry are also induced in the radiation shields of the cryostat during gradient switching, such that considerable torques also act on the radiation shields. In a realistic, actively shielded head gradient coil, the remaining torques and forces acting on the gradient coil and also on the radiation shields and on the main field magnet are indeed minimal, however, they do not completely disappear due to mechanical tolerances of the shielding coil.

U.S. Pat. No. 5,083,085 discloses a compact shield gradient coil system having a first set of gradient coils surrounded by a conducting shield. A second set of gradient coils is provided around the outside of the conducting shield. The first and second set of gradient coils and the conducting shield produce a linear gradient field inside the imaging volume and protect the imaging volume from interference, such as eddy current interference. However, a careful analysis of this arrangement shows that the conducting shield between the two sets of coils generates large temporal disturbances of the magnetic field due to eddy currents, itself and, furthermore, does not prevent the generation of eddy currents in the metallic components of the cryostat.

The present invention is directed towards solving the following problem. During gradient switching, e.g. with the head gradient coil, force impulses and torque impulses of small strength are generated in the gradient system itself and also in the radiation shields of the cryostat and in the main field coil due to imperfect active shielding which lead to mechanical vibrations of these components. The frequencies of such vibrations lie in a range above 50 Hz in a mechanically well-supported magnet system. If e.g. a metallic radiation shield vibrates mechanically in the strong background field of the main field magnet, secondary eddy currents are thereby induced in the radiation shield which, on the one hand, dampen the mechanical vibrations and on the other hand cause further small oscillatory disturbances of the magnetic field which can lead to reduced performance in magnetic resonance apparatus having high performance requirements.

It is the object of the present invention to present a gradient coil arrangement for a magnetic resonance apparatus having better shielding than conventional arrangements which does not cause any or which considerably reduces mechanical vibration of components of the arrangement.

SUMMARY OF THE INVENTION

The object is achieved in that the pipe-shaped shielding cylinder surrounding the gradient system and having a high electrical conductive value is rigidly mechanically connected with the gradient coil system and is preferably an integral mechanical component of the gradient system.

In this fashion, all high frequency parts of the magnetic field of a gradient coil are perfectly shielded during switching of the gradient current for both actively shielded and unshielded gradient coils and the transition from this perfect shielding effect to the actual shielding effect of an actively shielded gradient system—or to the state of completely non-existing shielding in case of non-actively shielded gradient coils—is gradual. Consequently, the introduction of all forces and torques into the entire gradient system mechanically containing the cylinder, into the radiation shields, and into the main field magnet is correspondingly slow. This prevents excitation of high-frequency mechanical vibrations of these components which lead to oscillatory magnetic field disturbances.

The shielding effect of such a system is perfect for highfrequency changes in the gradient strength, in dependent of whether the shielding cylinder has a perfect geometric construct i on. The actual electrical conductive values for such shielding cylinders made from copper or aluminium, at room temperature, are considerably smaller than those which can be realized with pure metals or superconducting materials within a cryostat but generally large enough to prevent or considerably reduce excitation of mechanical vibrations during gradient switching.

In a preferred embodiment, the various partial coils of the gradient coil and the shielding cylinder are cast together with a rigid and hardened casting compound to form one single mechanical unit. This provides particularly good mechanical connection between the shielding cylinder and the gradient system.

In a further preferred embodiment, the casting compound is a hardened plastic resin reinforced with glass fibers or carbon fibers. This effects a particularly hard mechanical connection between the shielding cylinder and the gradient coil using well tested technology.

In a preferred embodiment, the shielding cylinder is made from copper or aluminium. These materials are inexpensive and have a particularly large electric conductivity at room temperature which allows realization of relatively large electrical conductive values with relatively small wall thicknesses of the shielding cylinder.

In a preferred embodiment, the product of cylinder radius of the shielding cylinder and its electrical conductive value is at least 20000 Siemens m thereby exciting only highly weakened mechanical vibrations during gradient switching above a relatively low limiting frequency of 10 Hz. When copper having an electric conductivity of 5.8 * 107 Siemens/m and a cylinder radius of 0.3 m is used, the wall thickness of the shielding cylinder must only be approximately 1.15 mm.

In a further preferred embodiment, the product of the cylinder radius of the shielding cylinder and its electrical conductive value is at least 40000 Siemens m. In this case, only highly weakened mechanical vibrations are excited during gradient switching above a still smaller limiting frequency of 5 Hz. When using copper having an electric conductivity of $5.8*10^7$ Siemens/m and a cylinder radius of 0.3 m, the wall thickness of the shielding cylinder must be approximately 2.3 mm.

In a preferred embodiment, those metallic pipe-shaped components of the cryostat which have a larger electrical conductive value than the shielding cylinder of the gradient arrangement have a diameter which is at least 10% larger than that of the shielding cylinder of the gradient arrangement. In this fashion, despite the generally relatively fast inductive coupling processes (see DE 39 00 725 A1) from the radially inner metal pipes to radially outer metal pipes, the coupling of eddy currents into the metal pipes of the cryostat is nevertheless effected at a sufficiently slow rate.

In an embodiment, the gradient coils are not actively shielded. In this unfavorable case, excitation of mechanical vibrations during gradient switching is strongly reduced with respect to conventional gradient systems.

In an alternative, preferred embodiment, the gradient coils are actively shielded. The eddy currents induced in the shielding cylinder during gradient switching are thereby very small. They merely compensate for errors in the shielding coils relative to an ideal shielding arrangement. In this embodiment, the magnetic field in the examination volume of the magnetic resonance apparatus caused by the eddy currents in the shielding coil is of very little strength and can be easily compensated for using the methods described in the publication P. Jehenson, M. Westphal, N. Schuff, Journal of Magnetic Resonance 90, pages 264–278 (1990).

In a preferred embodiment, the shielding cylinder is longer in the axial direction than the gradient and shielding coils of the gradient system. This produces a particularly good shielding effect. On the other hand, the elongated shielding cylinder does, in practice, not impair patient access to the examination volume, since it has a larger diameter than the patient opening in the gradient system.

In a particular embodiment, the shielding cylinder is a seamless metal pipe, wherein the above described ideal shielding cylinder is particularly well-realized.

In an alternative embodiment, the shielding cylinder consists of a metal foil wound in several layers about the gradient system. This is a particularly simple production method for the shielding cylinder which, due to the inductive coupling of the various layers with one another, does not lose its shielding effect even when the layers wound on top of one another have no electric contact. Inductive coupling of such a shielding body with the main field magnet is, however, low. This has the advantage that it is possible to install and remove gradient coils having such a shielding cylinder into and out of the magnet when the main field magnet is charged without excessively large magnetic forces. For the case of a seamless metal cylinder, this requires great effort due to the eddy currents induced in the metal cylinder during installation and removal and the forces acting thereon.

In a further alternative embodiment, the shielding cylinder consists of several separated sheets of metal with large overlapping areas. The advantages are similar to those of a shielding cylinder consisting of a metal foil wound in several layers.

In a preferred embodiment, the inner fixtures of the radiation shields and of the main field magnet within the cryostat and the fixtures of the gradient system to the cryostat are designed such that the mechanical resonance frequencies of the gradient coil and of the oscillating metal components within the cryostat are as high as possible and are above approximately 10 Hz. In this case, excitation of mechanical vibrations of these components is prevented particularly effectively during gradient switching. Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention. It should be emphasized that the invention provides advantages not only in connection with superconducting main field magnets. In particular, actively shielded gradient arrangements of the type described herein exhibit nearly ideal behavior during switching processes having substantial frequency components sufficiently above a certain limiting frequency, irrespective of the magnet system type in which they are operated. The advantages of the invention are not necessarily limited to the reduction of mechanical vibrations. The ideal shielding effect of such a gradient arrangement at high switching frequencies offers further advantages for operation of such a system.

The invention is illustrated in the drawing and explained in more detail by means of embodiments.

DESCRIPTION OF THE PREFERRED EMBODIMENT

Figure 1:
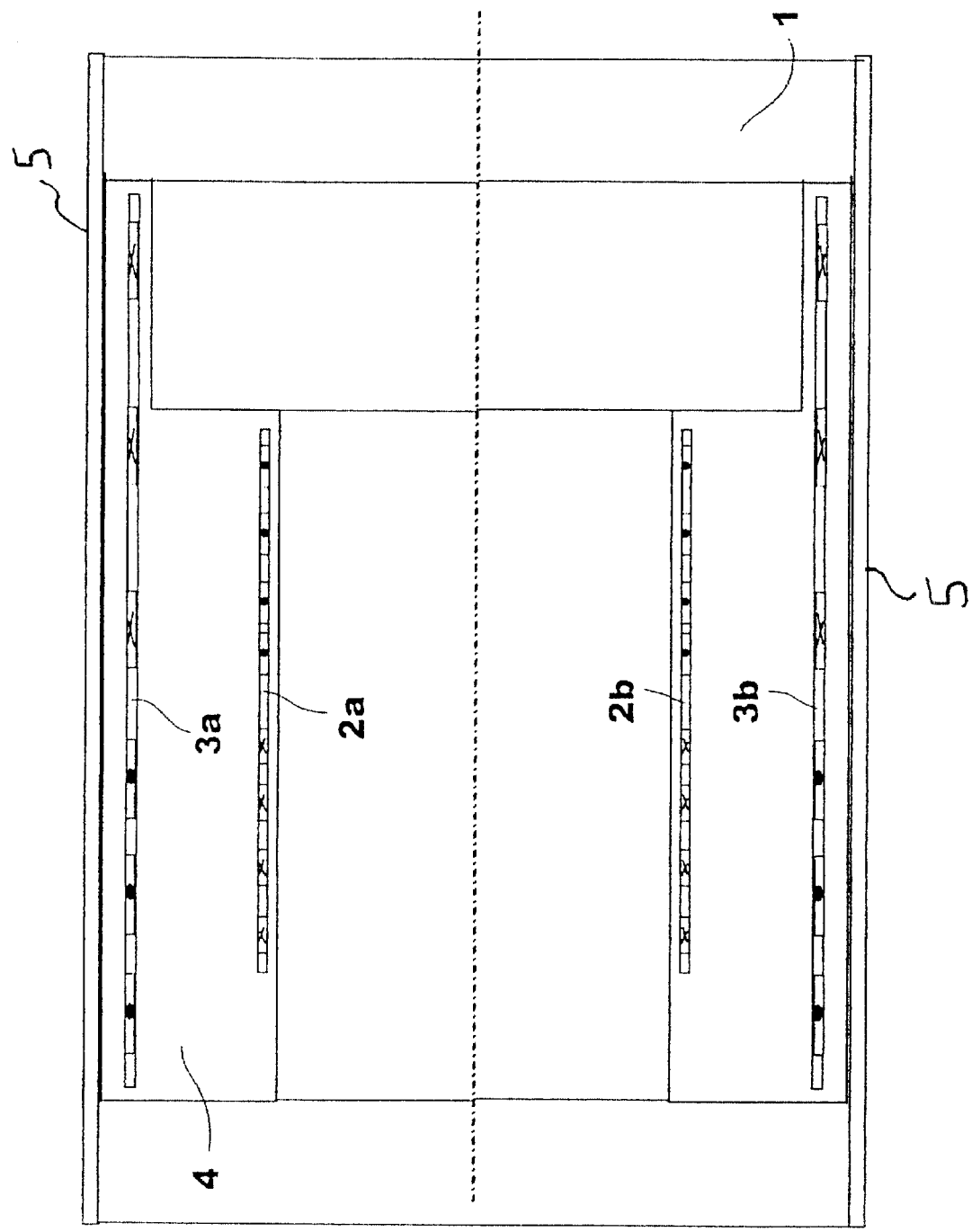
FIG. 1 shows a section through an inventive gradient arrangement, in the present case a head gradient system.
Figure 2:
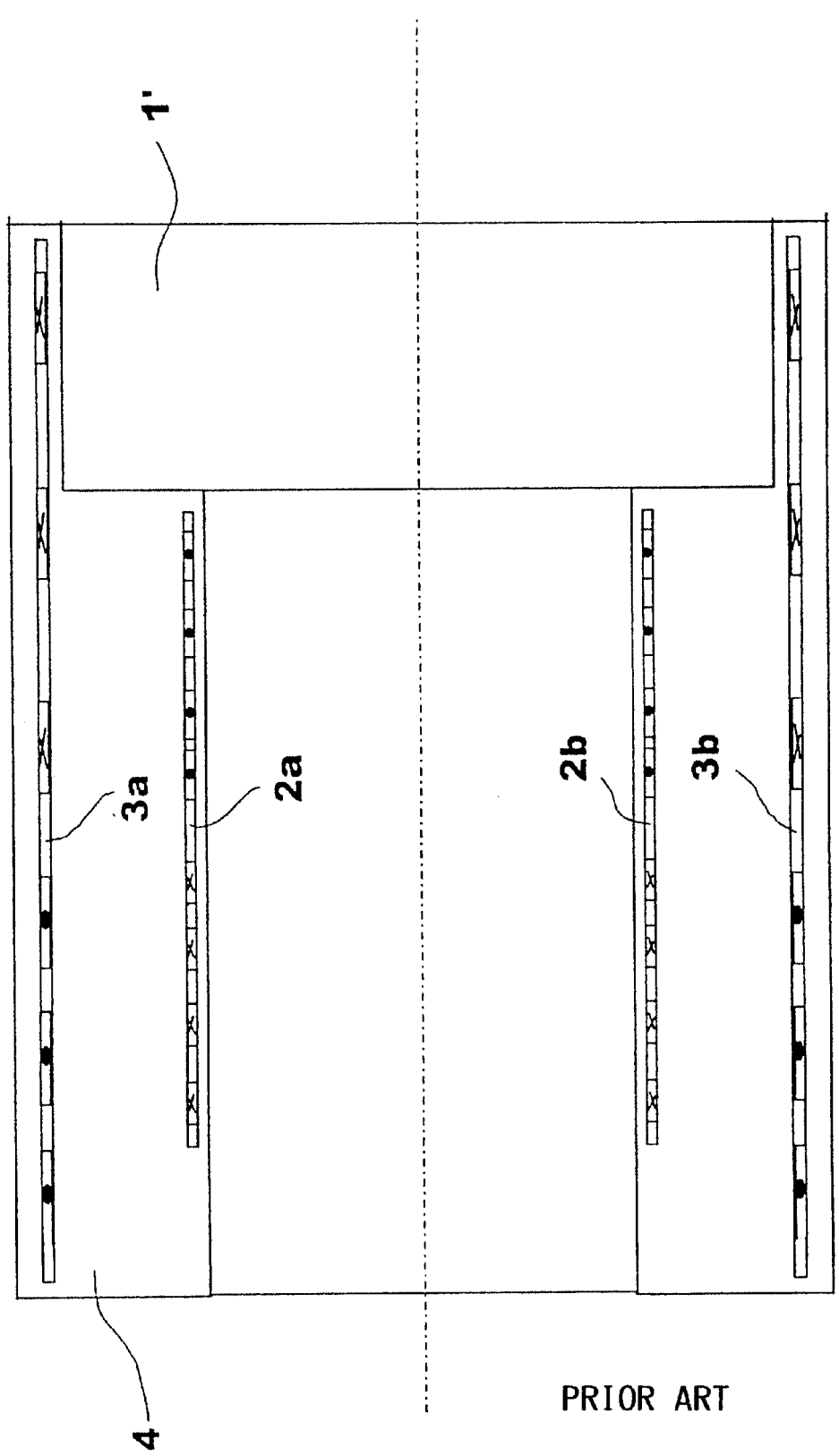
FIG. 2 shows a section through a conventional head gradient system.

The section through a conventional head gradient system 1' shown in FIG. 2 depicts a section of the upper part 2a and the lower part 2b of a transverse gradient coil on which a strong torque acts in the background field of the main field magnet. A section through the upper and lower part of the associated shielding coil 3a and 3b is also shown. The points and crosses in the coils characterize directions of the electric current out of and into the plane of the drawing. In practice, a torque acts on the shielding coil in the background field of the main field magnet with nearly the same strength as that on the gradient coil, but of opposite direction. This opposite torque would have exactly the same strength if the shielding coil were ideal. This is not exactly possible in practice due to unavoidable mechanical tolerances. The gradient coil and the shielding coil are rigidly mechanically connected through a hardened casting compound 4. Due to imperfect compensation of the torques, a resulting weak torque acts on the overall cast gradient system in the background field of the main field magnet and a torque of identical strength and of opposite direction acts on the main field coil. In FIG. 1, the head gradient system is augmented by the mechanically rigidly connected shielding cylinder 5 to form the inventive gradient arrangement 1. During gradient switching, eddy currents of low strength are induced in this shielding cylinder having a distribution which perfectly shields the outer regions directly after switching on the gradient current. In this state, there are no net forces or torques acting on the overall gradient system, including the shielding cylinder and forming a compact mechanical unit, directly after switching on the gradient current. No eddy currents are thereby induced in the metallic structure of the cryostat and the main field coil. As a result, these components also initially remain free from forces. In the time following switching-on of the gradient current, the eddy currents in the gradient coil are gradually reduced. At the same time, a torque builds up steadily with time from a negligeable initial value to a final value which is given by the net incomplete compensation of the torques on the gradient coil and shielding coil. There is a slow change in the forces and torques acting on the gradient arrangement, the metallic components of the cryostat, and the main field coil over time during switching of the gradient current. Consequently, no or only strongly attenuated mechanical vibrations of these components, which would lead to oscillatory disturbances of the magnetic field in the examination volume of the magnetic resonance apparatus, are excited. The shielding cylinder 5 is longer in the direction of the axis than the gradient coils 2a, 2b and the shielding coils 3a, 3b which effects a particularly good functioning of the shielding cylinder as mentioned above.

Figure 3:
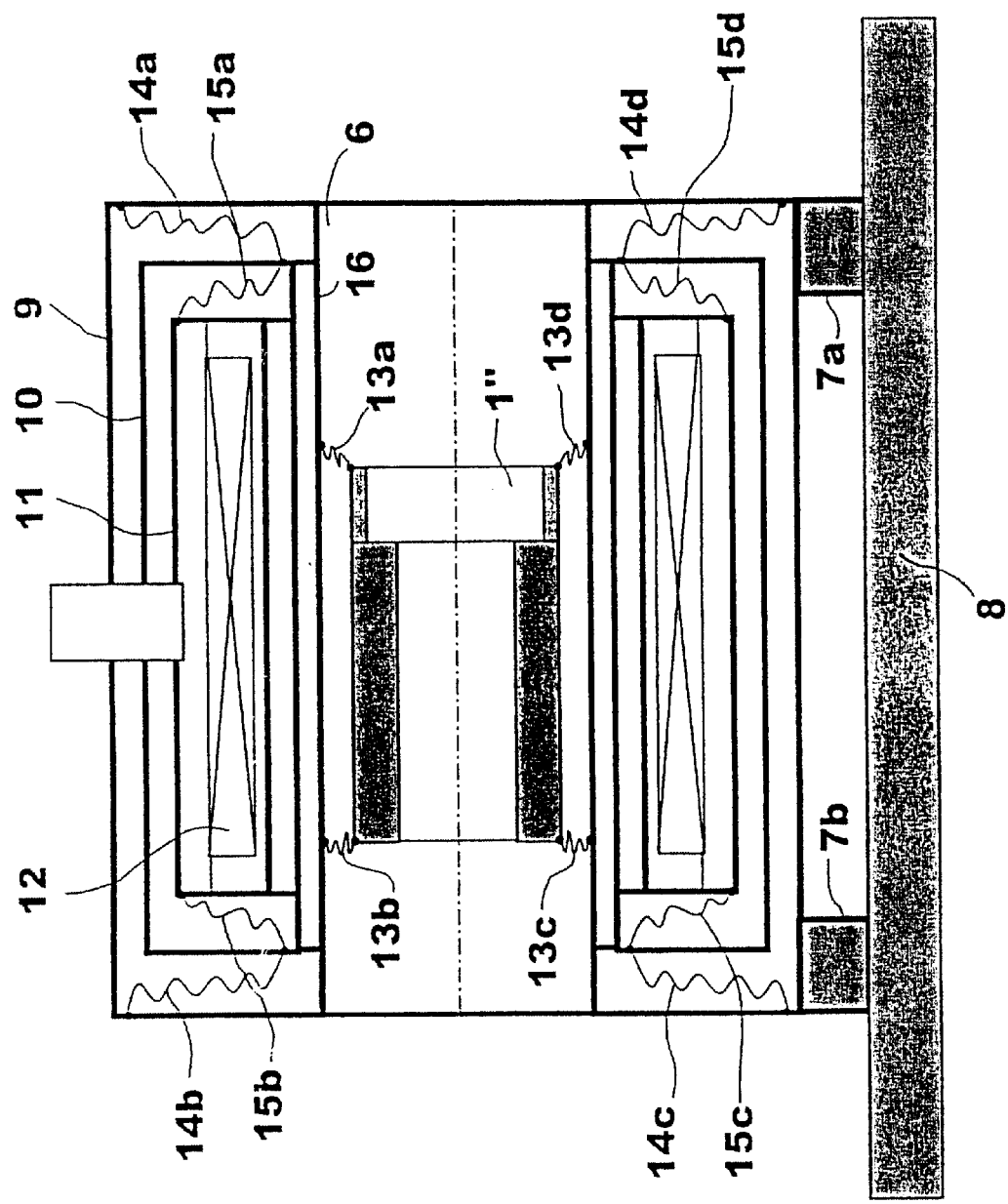
FIG. 3 shows a section through the magnet and gradient system of a magnetic resonance apparatus.

FIG. 3 shows the principles of mechanical fixtures and bracing of the various components of a magnet/gradient system of a magnetic resonance apparatus. The cryostat 6 which facilitates operation of the superconducting main field coil 12 cooled with liquid helium, is mounted with feet 7a and 7b on the base 8. The vacuum container 9 or outer surface of the cryostat encloses one or more radiation shields 10 and the helium tank 11 which generally contains liquid helium and, in general, the superconducting magnet coil 12. The gradient system or the gradient arrangement 1", as augmented by the shielding cylinder in accordance with the invention, and in the present case, having the shape of a head gradient system, is mounted with fastening elements 13a, 13b, 13c, 13d on the outer surface 9 of the cryostat, in the present case on its room temperature pipe 16. It is generally possible and can be advantageous to mount the gradient system 1" not directly onto the cryostat but to a retaining device (not shown herein) on the base 8 to prevent introduction of mechanical vibrations from the gradient system 1" into the cryostat. The radiation shield 10 is mounted to the outer surface 9 of the cryostat with fastening elements 14a, 14b, 14c, 14d. The helium tank 11 is mounted with fastening elements 15a, 15b, 15c, 15d to the surrounding radiation shield 10. These fastening elements can also directly pass from the helium tank 11 to the outer surface 9 through small openings in the radiation shields 10. The magnet coil 12 is generally relatively rigidly mechanically connected to the helium tank 9. All fastening elements 13a, 13b, 13c, 13d, 14a, 14b, 14c, 14d, 15a, 15b, 15c, 15d are illustrated with wavy lines to emphasize the resilient character of these fastening elements to allow mechanical vibration of the various components mounted to the elements. Inventive gradient arrangements do not generate such vibrations or generate only highly attenuated vibrations.

I claim:

1. A gradient coil system for a magnetic resonance apparatus having a main field magnet with a tube-shaped opening for receiving an object to be examined, the gradient coil system comprising:

a basic gradient coil;

an active shielding gradient coil surrounding and shielding said basic gradient coil;

a continuous tubular shielding cylinder for insertion within said tube-shaped opening, said shielding cylinder enclosing said active shielding, said shielding cylinder having a large electrical conductive value; and means for rigidly connecting together said shielding cylinder, said active shielding and said basic gradient coil.

2. The gradient coil system of claim 1, wherein said rigid connection means comprise a rigid and hardened casting compound.

3. The gradient coil system of claim 2, wherein said casting compound is a hardened plastic resin reinforced with glass or carbon fibers.

4. The gradient coil system of claim 1, wherein said shielding cylinder consists essentially of at least one of copper and aluminium.

5. The gradient coil system of claim 1, wherein a product between a cylinder radius of said shielding cylinder and said electrical conductive value is greater than or equal to at least one of 20000 Siemens m and 40000 Siemens m.

6. The gradient coil system of claim 1, wherein said shielding cylinder has a wall thickness of less than 2.5 mm.

7. The gradient coil system of claim 6, wherein said wall thickness is approximately 1 mm.

8. The gradient coil system of claim 1, wherein all metallic tubular components of the magnetic resonance apparatus having an electrical conductive value greater than that of said shielding cylinder have diameters which are at least 10% larger than that of said shielding cylinder.

9. The gradient coil system of claim 1, wherein said shielding cylinder has an axial length greater than axial lengths of said gradient coil and said active shielding.

10. The gradient coil system of claim 1, wherein said shielding cylinder consists essentially of a seamless metal pipe.

11. The gradient coil system of claim 1, wherein said shielding cylinder consists essentially of a metal foil wound in several layers about the active shielding.

12. The gradient coil system of claim 1, wherein said shielding cylinder consists essentially of several separate sheets of metal with larger overlapping areas.

13. The gradient coil system of claim 1, further comprising inner mounting means for connecting oscillatory metallic components of the magnetic resonance apparatus such that mechanical resonance frequencies of said oscillatory mechanical components are above approximately 10 Hz.

14. The gradient coil system of claim 1, wherein said shielding cylinder has a diameter considerably smaller than an inner diameter of the pipe-shaped opening.

\* \* \* \* \*